United States Patent [19]

Yokoi et al.

[11] Patent Number: 4,824,806

[45] Date of Patent: Apr. 25, 1989

[54] GLASS FIBERS HAVING LOW DIELECTRIC CONSTANT

[75] Inventors: Koji Yokoi; Mitsugi Yoshiyagawa; Seiichiro Manabe, all of Osaka, Japan

[73] Assignee: Nippon Sheet Glass Co., Ltd., Osaka, Japan

[21] Appl. No.: 138,489

[22] Filed: Dec. 28, 1987

Related U.S. Application Data

[63] Continuation-in-part of Ser. No. 029,568, Mar. 24, 1987, abandoned.

[30] Foreign Application Priority Data

Mar. 27, 1986 [JP] Japan ............................. 69196/86

[51] Int. Cl.$^4$ .................. C03C 13/00; C03C 3/091; C03C 3/093

[52] U.S. Cl. ................................. 501/35; 501/66; 501/67

[58] Field of Search ................. 501/35, 37, 66, 67

[56] References Cited

U.S. PATENT DOCUMENTS

| | | | |
|---|---|---|---|
| 2,685,527 | 8/1954 | Lebino ................... | 501/35 |
| 3,008,841 | 11/1961 | Tiede ..................... | 501/35 |
| 3,183,104 | 5/1965 | Thomas .................. | 501/35 |
| 4,101,709 | 7/1978 | Whang et al. ........... | 428/428 |
| 4,547,625 | 10/1985 | Tosaki et al. ........... | 501/16 |
| 4,582,748 | 4/1986 | Eastes et al. ............ | 501/35 |

FOREIGN PATENT DOCUMENTS

| | | |
|---|---|---|
| 0124800 | 11/1984 | European Pat. Off. . |
| 299440 | 8/1965 | Netherlands . |
| 390474 | 8/1965 | Switzerland . |

Primary Examiner—Mark L. Bell
Attorney, Agent, or Firm—Pollock, Vande Sande & Priddy

[57] ABSTRACT

Glass fibers having a low dielectric constant composed of a glass having a dielectric constant of not more than 5 and comprising:

$SiO_2$ 45–65% by weight,
$Al_2O_3$ 9–20% by weight,
$B_2O_3$ 13–30% by weight,
$CaO + MgO + ZnO$ 4–10% by weight,
$Li_2O + Na_2O + K_2O$ 0–5% by weight, Based on the total weight of the glass, the total proportion of $SiO_2$, $Al_2O_3$, $B_2O_3$, CaO, MgO, ZnO, $Li_2O$, $Na_2O$, and $K_2O$ being at least 95% by weight.

4 Claims, No Drawings

GLASS FIBERS HAVING LOW DIELECTRIC CONSTANT

This is a Continuation-in-Part of co-pending application Ser. No. 029,568, filed on Mar. 24, 1987 and entitled "Glass Fibers Having Low Dielectric Constant and now abandoned.

This invention relates to glass fibers having a low dielectric constant, and particularly to glass fibers having a low dielectric constant for use in reinforcing printed circuit boards.

As electronics devices and appliances have decreased in size and increased in density and performance in recent years, printed circuits have been required to possess higher density, faster signal speed and higher reliability. To increase signal speed, printed circuit boards should have a low dielectric constant, and this, in turn, leads to the need for grass fibers having a low dielectric constant for reinforcing printed circuit boards.

Presently, "E glass" is widely used as glass fibers for reinforcing printed circuit boards. E glass comprises 52–56 $SiO_2$, 12–16 $Al_2O_3$, 6–13 $B_2O_3$, 16–25 CaO and 0–6 MgO in percent by weight, and has a dielectric constant of about 6 which is lower than the dielectric constants of common glasses. But glass having a much lower dielectric constant has been required.

D glass and S glass are known to give glass fibers having a low dielectric constant. Since, however, these glasses have very high viscosity, melting at very high temperatures for long periods of time is required to obtain homogeneous glass with no bubbles. Furthermore, since the fiberization temperature for these glasses is considerably high, a platinum bushing used in fiberization has an extremely short life.

Japanese Laid-Open Patent Publication No. 130365/1984 describes a process for producing glass fibers having a low dielectric constant which comprises fiberizing and weaving E glass, for example, and dissolving components other than silica in the resulting glass woven cloth by treating it with an acidic solution followed by washing with water and moisture removal, to give high-silica fibers. This process requires additional steps, such as acid treatment, after the glass is melted, spun and woven. Furthermore, since the components other than silica are dissolved, fine voids occur at those parts which have previously been occupied by the removed components, and this results in a reduction in the strength of the glass fibers.

Japanese Laid-Open Patent Publication No. 151345/1983 describes a glass composition having a low dielectric constant comprising a $SiO_2$-$Al_2O_3$-$B_2O_3$-BaO type glass and a heat-resistant filler.

It is an object of this invention to provide glass fibers having a low dielectric constant which can be produced at relatively low melting and fiberization temperatures with excellent productivity and are suitable for reinforcing high-performance printed circuit boards.

According to this invention, the above problem of the prior art is solved by producing glass fibers having a low dielectric constant of 5 or less from a glass comprising 45 to 65% of $SiO_2$, 9 to 20% of $Al_2O_3$, 13 to 30% of $B_2O_3$, 4 to 10% of CaO+MgO+ZnO, and 0 to 5% of $Li_2O$+$Na_2O$+$K_2O$, the total proportion of $SiO_2$, $Al_2O_3$, $B_2O_3$, CaO, MgO, ZnO, $Li_2O$, $Na_2O$ and $K_2O$ being at least 95%, all percentages being by weight.

The limitation of the composition of the glass to the above range is for the following reasons.

$SiO_2$:

If the proportion of $SiO_2$ is less than 45% by weight, the dielectric constant of the glass fibers becomes high. If it is larger than 65% by weight, the viscosity of he glass becomes so high that it is difficult to dissolve or draw the glass into fibers. The preferred proportion of $SiO_2$ is 48 to 60% by weight.

$Al_2O_3$:

If the proportion of $Al_2O_3$ is less than 9% by weight, the chemical durability of the glass is reduced. If it is larger than 20% by weight, the dielectric constant and viscosity of the glass become too high.

$B_2O_3$:

This component produces a great effect of decreasing the dielectric constant of the glass and is also effective as a flux component. If its proportion is less than 13% by weight, the dielectric constant of the glass is high, and the viscosity of the glass also becomes high. If it is above 30% by weight, the chemical durability of the glass becomes very poor. Furthermore, its volatilization becomes vigorous, and it is difficult to produce homogeneous glass. The excessive use of $B_2O_3$ also quickens breakdown of the bushing used in fiberization. The preferred proportion of $B_2O_3$ is more than 20% and up to 30% by weight.

CaO, MgO, ZnO:

If the total proportion of these three components is below 4% by weight, the chemical durability of the glass if reduced. If it exceeds 10% by weight, the glass is liable to be devitrified, and also has a high dielectric constant. Among these components, CaO is most effective for preventing devitrification. Preferably, therefore, the glass contains at least 1% by weight of CaO. MgO and ZnO reduce the dielectric constant of the glass more than CaO, and from the standpoint of dielectric constant, MgO and ZnO are preferred.

In consideration of both devitrification and dielectric onstant, it is preferred that the mole ratio of Mgo+Zno to CaO+MgO+ZnO be from 0.4 to 0.7. When MgO and ZnO are contained singly in the same mole %, ZnO reduces dielectric constant more than MgO. When these two components are contained together, they further reduce the dielectric constant. It is preferred that the mole ratio of MgO to MgO+ZnO be from 0.25 to 1, more preferably from 0.35 to 0.75.

$Li_2$, $Na_2O$, $K_2O$:

These components are effective as a flux. If the total proportion of these components s larger than 5% by weight, the dielectric constant of the glass becomes high.

Optionally, the glass in accordance with this invention may contain not more than 5% by weight of BeO, not more than 2% by weight of SrO, not more than 1.5% by weight of BaO and not more than 1.5% by weight of PbO. Since these components act to increase dielectric constant, their proportions should not exceed the aforesaid limits.

Various impurities may possibly get into the glass, for example oxides of Ti and Fe from the raw materials, oxides of Zr, Ti, Fe and Cr from the refractory of the glass melting furnace, and an oxide of Mo from the electrode of the electric melting furnace. Oxides of Mo, Fe, Cr, Zr and Ti may permissibly be present in the glass if the amount of each of them is not more than 1% by weight.

$F_2$ used as a flux component may be contained in the glass in an amount of up to 2% by weight. $As_2O_3$ and $Sb_2O_3$ used as a clarifier may be contained in the glass in an amount of up to 2% by weight.

In any case, the total proportion of $SiO_2$, $Al_2O_3$, $B_2O_3$, CaO, MgO, ZnO, $Li_2O$, $Na_2O$ and $K_2O$ should be at least 95% by weight based on the total weight of the glass.

The glass in accordance with this invention can be obtained by melting a mixture of raw materials in predetermined proportions to a temperature of about 1500° C. or higher to melt the mixture. Melting is preferably effected by electrical heating by utilizing the Joule's heat of the glass itself.

The glass can be fiberized by using a conventional method of producing glass fibers. One example will be described below in a general manner.

The molten glass is molded into the form of a marble. The marble is re-melted at a temperature of about 300° to 1400° C. The molten glass is drawn continuously from platinum nozzles to form filaments having a diameter of about 5 to 13 micrometers. The filaments are bundled and wound up.

For use in reinforcing printed circuit boards, the glass fibers are formed into a mat and impregnated with a resin in advance.

The glass of this invention has a sufficiently low dielectric constant of not more than 5.0, and therefore the glass fibers of this invention are suitable for reinforcing printed circuit boards of high performance that permits high signal speeds.

The glass of this invention has a little tendency to devitrification. In other words, the devitrification temperature $T_L$ of the glass of this invention is sufficiently lower than its working temperature $T_W$. The glass working temperature $T_W$ is defined as a temperature at which log $\eta$ where $\eta$ is the viscosity of the glass in poises is 3. If the $T_L$ of the glass is equal to, or greater than, $T_W$, devitrification of glass occurs during the production of fibers from the glass. It is difficult therefore to produce glass fibers, and the resulting glass fibers have an inferior quality. The glass of this invention can circumvent such troubles.

The glass of this invention has sufficiently high water resistance. During fiberization, the glass fibers may be coated with an aqueous binder, or after fiberization, the fibers may be treated with an aqueous liquid to remove the binder. Furthermore, the glass fibers may be exposed to atmospheric air during perforation of printed circuit boards reinforced with these fibers. Accordingly, the glass fibers are required to have water resistance. The water resistance can generally be expressed by the amount of glass dissolved after glass powder is immersed in water at a predetermined temperature for a predetermined period of time. The amount of the glass of this invention dissolved has been found to be sufficiently smaller than that of conventional D glass.

The following examples illustrate the present invention more specifically.

The following raw materials were used in the following examples.

Source of $SiO_2$: silica sand (High Silica VSH-2, a product of Nichitsu Kogyo Co., Ltd.)

Source of $Al_2O_3$: $Al(OH)_3$ (special reagent grade, produced by Katayama Chemical Co., Ltd.)

Source of $B_2O_3$: $H_3BO_3$ (special reagent grade, produced by Katayama Chemical Co., Ltd.)

Source of CaO: $CaCO_3$ special reagent grade, produced by Katayama Chemical Co., Ltd.)

Source of MgO: basic magnesium carbonate (special reagent grade, produced by Katayama Chemical Co., Ltd.)

Source of ZnO: ZnO (special reagent grade, produced by Katayama Chemical Co., Ltd.)

Source of $Li_2O$: $Li_2CO_3$ (special reagent grade, produced by Kishida Chemical Co., Ltd.)

Source of $Na_2O$: $Na_2CO_3$ (special reagent grade, produced by Futaba Chemical Co., Ltd.)

Source of $K_2O$: $K_2CO_3$ (special reagent grade, produced by Katayama Chemical Co., Ltd.)

In the following examples, the devitrification temperature $T_L$, the working temperature $T_W$ (the temperature at which log $\eta$ where $\eta$ is the viscosity of the glass in poises is 3) and the water resistance of the glass (the amount dissolved) were measured by the following methods.

Devitrification temperature $T_L$

The glass was pulverized and sieved to obtain test samples having a particle diameter of 1400 to 1700 micrometers. An electrical furnace was set so that it had a continuous temperature gradient within a predetermined temperature range, for example a temperature range of 250° C., in accordance with the presumed devitrification temperature. A number of glass samples were placed along the temperature gradient of this electric furnace, and maintained for a predetermined period of time, for example for 4 hours.

The samples were withdrawn, and cooled. The samples were then examined under a polarizing microscope for the presence or absence of crystals. The highest temperature among those at which the devitrified samples were maintained is defined as the devitrification temperature.

Working temperature $T_W$

A platinum spherical body was suspended in the molten glass, and the load exerted on the spherical body at the time of pulling it up was measured (the "spherical body pull-up method"). The viscosity of the glass was calculated in accordance with the Stokes law. The viscosity $\eta$ can be calculated from the following equation.

$$\eta = K(W_1 - W_0)/v$$

K: the container coefficient
$W_1$: the weight of the spherical body
$W_0$: the load required for the spherical body to be balanced in the liquid
v: the average velocity under the load $W_1$ The viscosities (poises) were measured over a predetermined temperature range, and a viscosity-temperature curve was drawn. The temperature corresponding to $\eta = 10^3$ poises is defined as the working temperature $T_W$.

Amount dissolved (water resistance)

Measured by a method substantially in accordance with the alkali dissolving test in JIS R3502 (Method of Testing Glass Instruments and Devices Used for Chemical Analysis). Specifically, the glass sample having a predetermined particle diameter was held in boiling water for a predetermined period of time, and then, the aqueous solution containing the dissolved matter was quantitatively analyzed by plasma emission analysis, flame photometry, etc., and the amount of the sample dissolved was calculated. This method permits quantitative determination of all the matter dissolved from the glass including alkali.

EXAMPLE 1

$CaCO_3$, $H_3BO_3$, $Al(OH)_3$ and silica sand ($SiO_2$) were weighed so that the weight ratio of $CaO$-$B_2O_3$-$Al_2O_3$-$SiO_2$ was 7.5:25.0:15.0:52.5. They were then mixed to produce a glass-forming batch.

The batch was melted at 1500° C. for 4 hours and molded into the form of a marble and a plate, and then annealed.

The marble-like glass was then put in a glass fiberization furnace, melted at a temperature of 1300° to 1350° C., and drawn into glass filaments having a diameter of 5 to 13 micrometers. During the drawing, filament breakage attributed to the presence of undesired non-melted material and to devitrification did not occur, and the glass composition in this example was found to be suitable for fiberization.

The dielectric constant, viscosity at high temperatures, devitrification temperature and dissolved amount of the plate-like glass produced simultaneously with the production of the marble-like glass were measured. The glass was found to have a dielectric constant of 4.90, a working temperature of 1339° C., and a dissolved amount of 0.65 mg. In the measurement of the devitrification temperature, the glass was maintained at various temperatures in the range of 1140° to 1440° C. for 4 hours, but no devitrification was observed in any of the samples tested. Accordingly, the devitrification temperature of the glass was found to be lower than 1140° C.

EXAMPLES 2-11 AND COMPARATIVE EXAMPLE

Glass marbles were individually produced as in Example 1 from glass composition shown in Examples 2 to 11 in Table 1 and, for comparison, E glass and D glass. The glass marbles were individually spun at a temperature near the point at which log η was 3 to form glass filaments. The glass compositions of Examples 2 to 11, like that in Example 1, showed good meltability and drawability.

The dielectric constants, high-temperature viscosities, devitrification temperatures and dissolved amounts of these glasses were measured, and the results are shown in Table 1.

As shown in Table 1, the glasses obtained in the examples of the invention have a dielectric constant of 5 or less which is much lower than the dielectric constant of E glass which is 6.8. The temperature (working temperature) at which log η is 3.0 was, for example, about 1260° C. in Example 10 which is higher than E glass but at least 200° C. lower than that of D glass (1508° C.).

The devitrification temperatures of the glasses of the invention are lower than their working temperatures, showing good workability. Furthermore, the water resistances (dissolved amount) of the glasses of the invention are generally comparable to E glass and superior to D glass.

As stated above, the glass in accordance with this invention is relatively easy to melt and draw and gives glass fibers having excellent water resistance and effective electrical properties represented by its dielectric constant of not more than 5.

TABLE 1

| Examples | Comparison E glass | Comparison D glass | 1 | 2 | 3 | 4 | 5 | 6 | 7 | 8 | 9 | 10 | 11 | 12 |
|---|---|---|---|---|---|---|---|---|---|---|---|---|---|---|
| Li2O | 0 | | | | 0.18 | 0.18 | 0.18 | 0.18 | 0.18 | 0.18 | 0.18 | 0.18 | 1.8 | 0.18 |
| Na2O | 0.4 | 1.5 | 0 | 0 | 0.12 | 0.12 | 0.12 | 0.12 | 0.12 | 0.12 | 0.12 | 0.12 | 1.2 | 0.12 |
| K2O | 0.24 | | | | | | | | | | | 0.14 | | |
| F2 | 0.45 | | | | | | | | | | | | | |
| CaO | 22.8 | 0.5 | 7.5 | 4.1 | 8.0 | 4.4 | 4.1 | 7.0 | 5.0 | 4.9 | 3.6 | 3.6 | 1.3 | 6.3 |
| MgO | 0.41 | 0.2 | | 1.5 | | | | | 1.9 | 3.7 | 1.3 | 1.3 | 0.9 | |
| ZnO | 0 | | | 3.0 | | | | | | | 2.6 | 2.5 | 1.8 | |
| SiO | 0.21 | | | | | | | | | | | | | |
| Al2O3 | 14.2 | | 15.0 | 17.0 | 16.0 | 10.6 | 9.9 | 14.0 | 15.1 | 14.8 | 17.0 | 16.7 | 9.6 | 13.6 |
| B2O3 | 6.67 | 22.7 | 25.0 | 15.0 | 19.9 | 25.0 | 29.9 | 29.9 | 25.1 | 24.7 | 24.9 | 25.6 | 29.1 | 20.5 |
| SiO2 | 55.2 | 74.7 | 52.5 | 59.5 | 55.8 | 59.8 | 55.8 | 48.9 | 52.7 | 51.7 | 50.3 | 49.9 | 54.3 | 59.3 |
| Dielectric constant | 6.79 | 3.77 | 4.90 | 4.94 | 4.97 | 4.42 | 4.33 | 4.85 | 4.76 | 4.80 | 4.79 | 4.80 | 4.78 | 4.78 |
| Working temperature (°C.) | 1190 | 1508 | 1339 | 1424 | 1372 | 1446 | 1391 | 1264 | 1313 | 1307 | 1294 | 1264 | 1222 | 1430 |
| Devitrification temperature (°C.) | 1150 | above 1400 | below 1140 | 1187 | below 1140 | below 1140 | below 1140 | below 1100 | below 1050 | below 1050 | 1256 | 1260 | below 1050 | below 1100 |
| Water resistance (dissolved amount) (mg) | 0.30 | 1.75 | 0.65 | not measured | 0.23 | not measured | not measured | 1.49 | 0.43 | 0.31 | 0.25 | not measured | not measured | 0.22 |

What is claimed is:

1. Glass fibers having a low dielectric constant composed of a glass having a dielectric constant of not more than 5 and consisting essentially of
   $SiO_2$ 45–65% by weight,
   $Al_2O_3$ 9–20% by weight,
   $B_2O_3$ 20.5–30% by weight,
   $CaO + MgO + ZnO$ 4–10% by weight,
   $Li_2O + Na_2O + K_2O$ 0–5% by weight,
   based on the total weight of the glass, the total proportion of $SiO_2$, $Al_2O_3$, $B_2O_3$, $CaO$, $MgO$, $ZnO$, $Li_2O$, $Na_2O$, and $K_2O$ being at least 95% by weight.

2. The glass fibers according to claim 1 which contain 48 to 60% by weight of $SiO_2$.

3. The glass fibers according to claim 1 wherein the mole ratio of $MgO + ZnO$ to $CaO + MgO + ZnO$ is from 0.4 to 0.7.

4. The glass fibers according to claim 1 wherein the mole ratio of $MgO$ to $MgO + ZnO$ is from 0.25 to 1.

* * * * *